US008022440B2

(12) United States Patent
Nakano et al.

(10) Patent No.: US 8,022,440 B2
(45) Date of Patent: Sep. 20, 2011

(54) COMPOUND SEMICONDUCTOR EPITAXIAL SUBSTRATE AND MANUFACTURING METHOD THEREOF

(75) Inventors: Tsuyoshi Nakano, Ichihara (JP); Masahiko Hata, Tsuchiura (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 2 days.

(21) Appl. No.: 10/545,295

(22) PCT Filed: Feb. 4, 2004

(86) PCT No.: PCT/JP2004/001117
§ 371 (c)(1),
(2), (4) Date: Aug. 11, 2005

(87) PCT Pub. No.: WO2004/073070
PCT Pub. Date: Aug. 26, 2004

(65) Prior Publication Data
US 2006/0192228 A1    Aug. 31, 2006

(30) Foreign Application Priority Data
Feb. 12, 2003   (JP) .................. 2003-033466

(51) Int. Cl.
*H01L 31/0328* (2006.01)
*H01L 31/0336* (2006.01)
*H01L 29/06* (2006.01)

(52) U.S. Cl. ... 257/194; 257/20; 257/192; 257/E21.407; 257/E29.246; 438/285

(58) Field of Classification Search .................. 257/194, 257/192, 24, 20, E29.246, E21.407; 438/285
See application file for complete search history.

(56) References Cited

U.S. PATENT DOCUMENTS
5,319,223 A * 6/1994 Fujita et al. .................. 257/190
(Continued)

FOREIGN PATENT DOCUMENTS
| JP | 06-21106 A | 1/1994 |
| JP | 8-340012 A | 12/1996 |
| JP | 9-246529 A | 9/1997 |
| JP | 11-097669 A | 4/1999 |
| JP | 11-243058 A | 9/1999 |

(Continued)

OTHER PUBLICATIONS

T. Tanaka et al., "Ordering-induced electron accumulation at GaInP/GaAs hetero-interfaces", *Journal of Crystal Growth*, vol. 221, 2000, pp. 515-519.

(Continued)

*Primary Examiner* — Shouxiang Hu
(74) *Attorney, Agent, or Firm* — Sughrue Mion, PLLC (57) ABSTRACT

A compound semiconductor epitaxial substrate having a pseudomorphic high electron mobility field effect transistor structure including an InGaAs layer as a strained channel layer and an AlGaAs layer containing n type impurities as a front side electron-donating layer, wherein said substrate contains an InGaP layer in an orderly state on the front side of the above described InGaAs layer as the strained channel layer.

2 Claims, 4 Drawing Sheets

| Layer | ID |
|---|---|
| i-In₀.₄₈₃Ga₀.₅₁₇P  28nm | 33 |
| n-In₀.₄₈₃Ga₀.₅₁₇P  10nm  4E18/cm³ | 32B |
| i-Al₀.₂₄Ga₀.₇₆As  3nm | 31 |
| i-GaAs  5nm | 30 |
| i-In₀.₃₀Ga₀.₇₀As  7.5nm | 29 |
| i-GaAs  5nm | 28 |
| i-Al₀.₂₄Ga₀.₇₆As  3nm | 27 |
| n-Al₀.₂₄Ga₀.₇₆As  4nm  4E18/cm³ | 26 |
| i-Al₀.₂₄Ga₀.₇₆As  200nm | 25 |
| i-GaAs  250nm | 24 |
| i-Al₀.₂₅Ga₀.₇₅As  250nm | 23 |
| i-GaAs  200nm | 22 |
| GaAs SUBSTRATE | 21 |

U.S. PATENT DOCUMENTS

| | | | |
|---|---|---|---|
| 5,610,410 A * | 3/1997 | Imanishi | 257/76 |
| 5,739,558 A * | 4/1998 | Ishida et al. | 257/192 |
| 5,751,028 A * | 5/1998 | Kikkawa | 257/192 |
| 5,762,706 A * | 6/1998 | Saito et al. | 117/105 |
| 5,952,672 A | 9/1999 | Kikkawa | |
| 6,294,802 B1 | 9/2001 | Unozawa | |

FOREIGN PATENT DOCUMENTS

| | | |
|---|---|---|
| JP | 2000-21897 A | 1/2000 |
| JP | 2000-31467 | 1/2000 |
| JP | 2000-357791 A | 12/2000 |
| JP | 2001-177089 | 6/2001 |
| JP | 2001-250939 A | 9/2001 |

OTHER PUBLICATIONS

J.W. Matthews et al., "Defects in Epitaxial Multilayers", *Journal of Crystal Growth*, vol. 27, 1974, pp. 118-125.

J.W. Matthews et al., "Defects in Epitaxial Multilayers", *Journal of Crystal Growth*, vol. 32, No. 2, 1976, pp. 265-273.

\* cited by examiner

| | |
|---|---|
| i-In$_{0.483}$Ga$_{0.517}$P  28nm | 33 |
| n-Al$_{0.24}$Ga$_{0.76}$As  10nm  4E18/cm$^3$ | 32 |
| i-Al$_{0.24}$Ga$_{0.76}$As  3nm | 31 |
| i-GaAs  5nm | 30 |
| i-In$_{0.30}$Ga$_{0.70}$As  7.5nm | 29 |
| i-GaAs  5nm | 28 |
| i-Al$_{0.24}$Ga$_{0.76}$As  3nm | 27 |
| n-Al$_{0.24}$Ga$_{0.76}$As  4nm  4E18/cm$^3$ | 26 |
| i-Al$_{0.24}$Ga$_{0.76}$As  200nm | 25 |
| i-GaAs  250nm | 24 |
| i-Al$_{0.25}$Ga$_{0.75}$As  250nm | 23 |
| i-GaAs  200nm | 22 |
| GaAs SUBSTRATE | 21 |

FIG. 3

| | |
|---|---|
| i-In$_{0.483}$Ga$_{0.517}$P  28nm | 33 |
| n-In$_{0.483}$Ga$_{0.517}$P  10nm  4E18/cm$^3$ | 32B |
| i-Al$_{0.24}$Ga$_{0.76}$As  3nm | 31 |
| i-GaAs  5nm | 30 |
| i-In$_{0.30}$Ga$_{0.70}$As  7.5nm | 29 |
| i-GaAs  5nm | 28 |
| i-Al$_{0.24}$Ga$_{0.76}$As  3nm | 27 |
| n-Al$_{0.24}$Ga$_{0.76}$As  4nm  4E18/cm$^3$ | 26 |
| i-Al$_{0.24}$Ga$_{0.76}$As  200nm | 25 |
| i-GaAs  250nm | 24 |
| i-Al$_{0.25}$Ga$_{0.75}$As  250nm | 23 |
| i-GaAs  200nm | 22 |
| GaAs SUBSTRATE | 21 |

FIG. 4

| | |
|---|---|
| i-Al$_{0.24}$Ga$_{0.76}$As  28nm | 33A |
| n-In$_{0.483}$Ga$_{0.517}$P  10nm 4.3E18/cm$^3$ | 32B |
| i-In$_{0.483}$Ga$_{0.517}$P  3nm | 31B |
| i-GaAs  5nm | 30 |
| i-In$_{0.30}$Ga$_{0.70}$As  7.5nm | 29 |
| i-GaAs  5nm | 28 |
| i-Al$_{0.24}$Ga$_{0.76}$As  3nm | 27 |
| n-Al$_{0.24}$Ga$_{0.76}$As  4nm 4.3E18/cm$^3$ | 26 |
| i-Al$_{0.24}$Ga$_{0.76}$As  200nm | 25 |
| i-GaAs  250nm | 24 |
| i-Al$_{0.25}$Ga$_{0.75}$As  250nm | 23 |
| i-GaAs  200nm | 22 |
| GaAs SUBSTRATE | 21 |

COMPOUND SEMICONDUCTOR EPITAXIAL SUBSTRATE AND MANUFACTURING METHOD THEREOF

TECHNICAL FIELD

The present invention relates to a compound semiconductor epitaxial substrate for pseudomorphic high electron mobility transistors comprising III-V compound semiconductors and a manufacturing method thereof.

BACKGROUND ART

High electron mobility field effect transistors (hereafter HEMT) have been used as an important component of radiofrequency communication equipment. The HEMT is characterized by the selectively doped heterostructure consisting of different materials for the electron-donating layer (dope layer) and the channel layer in which electrons travel. In this heterostructure, electrons supplied from n type impurities in the electron-donating layer collects in the potential wells formed on the channel side of the heterojunction interface due to the difference of electron affinity of materials constituting the heterojunction, resulting in the formation of two dimensional electron gas. Thus n type impurities supplying electrons are in the electron-donating layer, and because the electrons supplied from here separate ionization impurities spatially from electrons as they travel through the high-purity channel, the two dimensional electron gas in the channel is not scattered by ionization impurities and has high electron mobility.

While the HEMT is normally manufactured using an epitaxial substrate laminating thin film crystal layers having given electronic characteristics on a GaAs single crystal substrate so as to possess given structure, it is required to control the thin film crystal layer which forms the HEMT structure on the order of monoatomic layers so that the channel can have high electron mobility. Thus, to manufacture an epitaxial substrate having the HEMT structure, the molecular beam epitaxy (hereafter referred to as MBE) method or the metalorganic chemical vapor deposition (hereafter referred to as MOCVD) method has been used conventionally.

Of these methods, the MOCVD method, in particular, which involves using organometallic compounds or hydrides of atomic species constituting the epitaxial layer as raw materials and growing crystals on the substrate through thermal decomposition, has been widely used in recent years because of its wide applicability range and fitness for precise control of crystal composition and the film thickness.

III-V compound semiconductor materials widely used for these epitaxial substrates include GaAs and AlGaAs because they allow matching the lattice constant with given composition and various types of heterojunction are possible while keeping good crystallinity. However, because it is necessary to increase the electron mobility of the channel layer in order to improve the performance of HEMT, InGaAs has been used in recent years as a material for the channel layer instead of GaAs because it is not only superior in electron transport property but it can also change energy gaps dramatically according to the In composition and contain two dimensional electrons effectively. In addition, AlGaAs or GaAs can be used as a material to be combined with InGaAs.

Because lattice matching for GaAs was impossible, InGaAs could not be used formerly to obtain an epitaxial substrate having sufficient physical property. However, since reliable heterojunction was found possible even in the lattice mismatch system without causing a reduction in crystallinity such as dislocation if the mismatching is within the threshold of elastic deformation, efforts have been made towards practical use.

The threshold of film thickness of strained crystalline layer in such lattice mismatch system is given as a function of crystal layer composition, and in the case of the InGaAs layer for the GaAs layer, for example, the theoretical formula of Mathews is disclosed in J. Crystal Growth, 27 (1974), p. 118 and J. Crystal Growth, 32 (1976), p. 265. These theoretical formulas have been found almost correct in experiments.

In addition, JP-A-6-21106 discloses a technique to improve electron mobility by optimizing the In composition of the InGaAs strain layer and the film thickness of the InGaAs layer used for the channel layer of the p-HEMT structure using a given relational expression. Actually, an InGaAs layer with In composition of 0.20 and film thickness of about 13 nm has been put to practical use as an InGaAs strained channel layer that allows epitaxial growth without reducing crystallinity.

By using an epitaxial growth substrate configured to use such InGaAs layer for the channel layer part of conventional HEMT in which two dimensional electrons flow, electron devices have been fabricated that have higher mobility and superior noise characteristics compared to conventional ones. The HEMT using the InGaAs layer for the channel layer in which two dimensional electrons flow is referred to as a pseudomorphic high electron mobility transistor (hereafter pseudomorphic-HEMT or p-HEMT).

In p-HEMT, a layer called a space layer is usually formed between the strained channel layer, InGaAs layer, and the front side electron-donating layer as the layer to reduce the effect of impurity scattering due to the front side electron-donating layer on the electrons flowing in the channel layer. Furthermore, a layer to install a gate electrode of transistor generally referred to as a gate barrier layer or Schottky layer is formed on the surface side of the front side electron-donating layer. For these space layers and gate barrier layers, GaAs layers or AlGaAs layers have been used conventionally.

In addition, in p-HEMT, a GaAs or AlGaAs layer is usually formed as the electron-donating layer. However, an InGaP layer joined to a GaAs or AlGaAs layer in a lattice matching manner has been also used.

However, using a GaAs or AlGaAs layer for the space or gate barrier layer is problematic; GaAs has too small a band gap to allow gate withstand voltage for transistor gates, and AlGaAs has a problem in that incorporation of impurities results in the loss of crystallinity and surface state stability.

In addition, conventional p-HEMT structure required a layer rich in dopant as an electron-donating layer in order to achieve an amount of two dimensional electron gas required in the channel layer to improve the current value of transistors. However, for the reasons described above, it was difficult to further improve transistor performance because the crystallinity of the electron-donating layer decreased due to excess dopant and the withstand voltage of the gate decreased.

As means of solving these problems, a configuration designed to lower the dopant concentration of the front side electron-donating layer and thicken its film thickness, or in the case of a double hetero structure, a configuration designed to lower the dopant concentration of the front side electron-donating layer and increase the dopant concentration of the back side has been proposed.

However, even if the configuration proposed above is employed in an epitaxial substrate of p-HEMT structure, it is difficult to employ an electron-donating layer with a low dopant concentration to achieve a high two dimensional electron gas concentration and obtain an epitaxial substrate of p-HEMT structure having good transistor characteristics such as pinch off characteristics if GaAs or AlGaAs is used for the gate barrier layer.

In this view, for the p-HEMT used for various mobile equipment such as cell phones, improving gate withstand voltage and pinch off characteristic is required, and it is necessary to use an electron-donating layer with a low dopant concentration to increase two dimensional electron gas concentration to improve the characteristics of electronic devices. However, the above described conventional technologies are not sufficient to meet these needs.

DISCLOSURE OF THE INVENTION

It is an object of the present invention to provide a compound semiconductor epitaxial substrate that can solve the above described problems with conventional technologies, and a manufacturing method thereof.

It is another object of the present invention to provide a compound semiconductor epitaxial substrate having a p-HEMT structure that is designed to improve gate withstand voltage and pinch off characteristics, and a manufacturing method thereof.

It is another object of the present invention to provide a compound semiconductor epitaxial substrate having a p-HEMT structure that employs an electron-donating layer with a low dopant concentration to achieve a high two dimensional electron gas concentration and has high electron mobility, and a manufacturing method thereof.

To solve the above described problems, in one aspect of the present invention, an orderly InGaP layer was established on the front side (opposite side of the substrate) of the InGaAs layer, which is the strained channel layer of p-HEMT, and, because the interface state of the InGaP layer was low and interface charge was generated, an electron-donating layer with a low dopant concentration was used to fabricate an epitaxial substrate having the HEMT structure with both high two dimensional electron gas concentration and high electron mobility. Gate withstand voltage can be improved if the front side electron-donating layer of p-HEMT can be grown at low dopant concentration, because electric field intensity between the gate electrode and channel decreases.

Here, the InGaP layer in orderly state can be defined by band gap values for InGaP. The band gap of InGaP varies depending on the growth temperature when the InGaP layer grows, and the InGaP layer will be in orderly state when the band gap is minimal. Band gap values for the InGaP in orderly state were 1.84 eV to 1.85 eV. In semiorderly state in which the band gap value is larger than this, the effect of interface charge on the increase in dopant efficiency is observed, though it is small, because the generation of interface charge continues.

In a first aspect of the present invention, a compound semiconductor epitaxial substrate is proposed that has a pseudomorphic high electron mobility transistor structure including an InGaAs layer as the strained channel layer and an AlGaAs layer containing n type impurities as the front side electron-donating layer, the substrate comprising an InGaP layer in an orderly state on the front side of the above described InGaAs layer which is the strained channel layer.

In a second aspect of the present invention, a compound semiconductor epitaxial substrate is proposed that has a pseudomorphic high electron mobility transistor structure including an InGaAs layer as the strained channel layer and an InGaP layer containing n type impurities as the front side electron-donating layer, the substrate comprising an InGaP layer in an orderly state on the front side of the above described InGaAs layer which is the strained channel layer.

In a third aspect of the present invention, a method of manufacturing a compound semiconductor epitaxial substrate of the above described first or second aspect is proposed, the method comprising the epitaxial growth of each compound semiconductor layer using the metal-organic chemical vapor deposition (MOCVD) method.

BEST MODE FOR CARRYING OUT THE INVENTION

An embodiment of the present invention is described in detail below by reference to the drawings.

Figure 1:
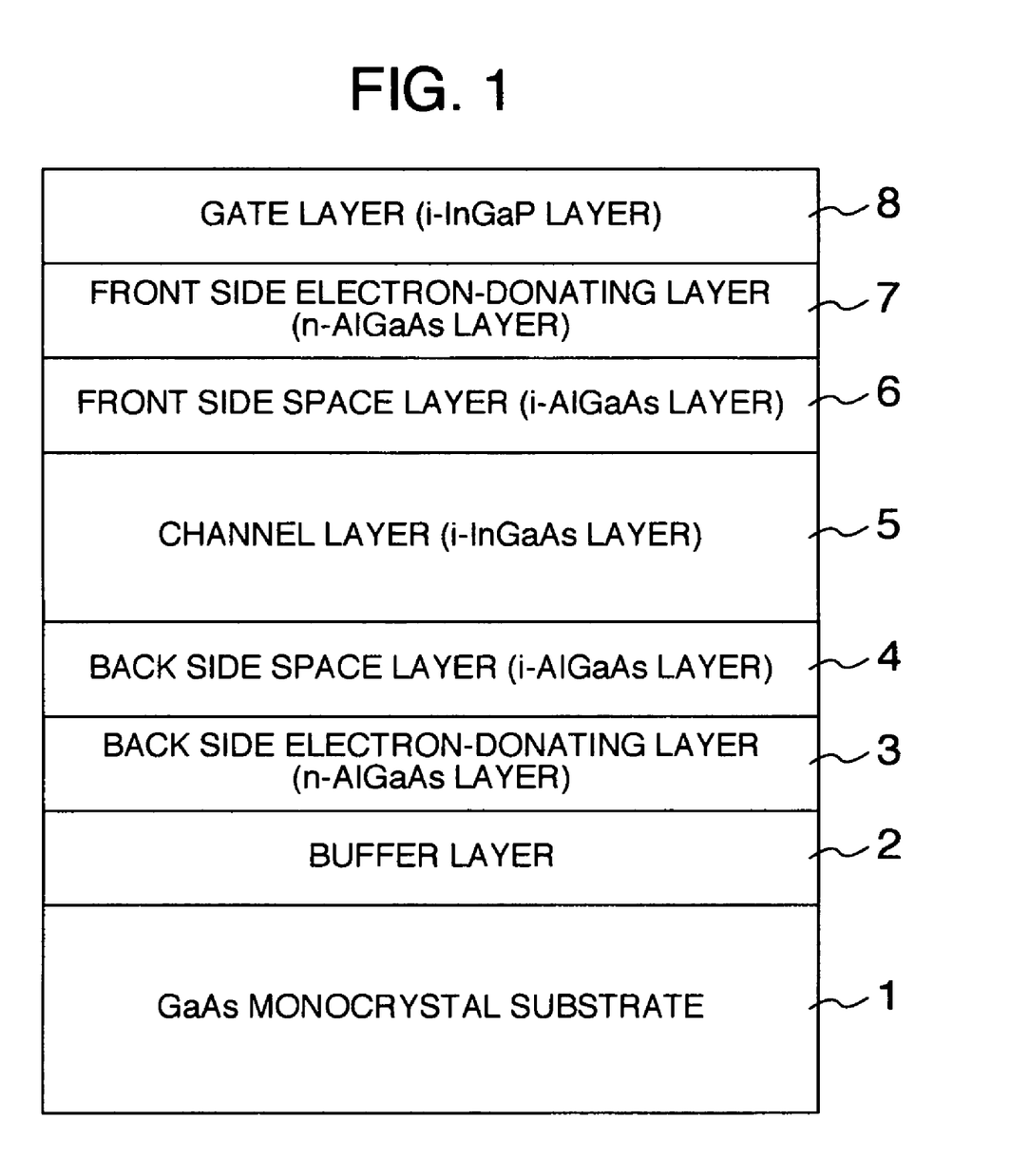
FIG. 1 is a layer structure view showing an embodiment of the epitaxial substrate according to the present invention.

FIG. 1 is a layer structure view showing an embodiment of an epitaxial substrate of the p-HEMT structure according to the present invention. In FIG. 1, reference numeral 1 denotes a GaAs monocrystal substrate, and reference numeral 2 denotes a buffer layer formed on the GaAs monocrystal substrate 1. Reference numeral 3 denotes the back side electron-donating layer doped with n type impurities that is formed as a n-AlGaAs layer, and a back side space layer (i-AlGaAs layer) 4 is formed on the back side electron-donating layer 3. Reference numeral 5 denotes a channel layer in which two dimensional electrons flow to form two dimensional electron gas, and represents a strained channel layer formed as an i-InGaAs layer.

On the channel layer 5 are formed a front side space layer 6 consisting of an i-AlGaAs layer and a front side electron-donating layer 7 formed as a n-AlGaAs layer, and a gate barrier layer 8 consisting of an i-InGaP layer in orderly state is formed in the upper part (on the opposite side of the GaAs monocrystal substrate 1) of the front side electron-donating layer 7.

Although an i-InGaP layer in orderly state is formed as the gate barrier layer in FIG. 1, the i-InGaP layer may be installed as a space layer or a layer further on the front side of the gate barrier layer if it is on the front side of the i-InGaAs layer which is a strained channel layer. In addition, the i-InGaP layer 8, i-AlGaAs layer 6, i-InGaAs layer 5 and i-AlGaAs layer 4, all of which are shown to be of the i type in FIG. 1, may also be of the n or p type.

Because the epitaxial substrate in FIG. 1 is formed as described above, electrons are supplied to the channel layer 5 from the back side electron-donating layer 3 through the back side space layer 4 as well as from the front side electron-donating layer 7 through the front side space layer 6. As a result, a high-density two dimensional electron gas is formed in the channel layer 5. Because the interface state is low as an i-InGaP layer in orderly state is formed on the front side electron-donating layer 7 as the gate barrier layer 8, and due to the effect of interface charge, the two dimensional electron gas concentration in the channel layer 5 can be maintained at high levels even if the dopant concentration in the electron-donating layer is low. Thus, gate withstand voltage can be improved because a low dopant concentration can be used and the electric field intensity between the gate electrode and channel can be lowered. In addition, because an i-InGaP layer with a large band gap is formed as the gate barrier layer 8, an improvement in gate withstand voltage can be expected compared to the gate barrier layer using GaAs or AlGaAs. Because two dimensional electron gas with an increased concentration is also achieved with the same amount of dopant as before, the present invention is advantageous for use in p-HEMT used with a high driving current value.

The embodiment in FIG. 1 shows a case in which an AlGaAs layer containing n type impurities is used as the front side electron-donating layer 7. However, the front side electron-donating layer 7 is not limited to this configuration, and the above described AlGaAs layer may be replaced by an InGaP layer containing n type impurities, which is expected to have similar effects as the configuration shown in FIG. 1. If an InGaP layer is used for the electron-donating layer, no DX center is formed that may affect the temperature characteristics of transistors compared to the AlGaAs layer, and doping with a high concentration of dopant will be possible.

Furthermore, when a n-InGaP layer is used as the front side electron-donating layer 7, the AlGaAs layer may be replaced by an i-InGaP layer for the front side space layer 6. Thus, if an i-InGaP layer is used for the space layer, a space layer with good crystallinity can be formed that incorporates fewer impurities, such as C and O, than when an i-AlGaAs layer is used.

Obviously, the same effect as the configuration shown in FIG. 1 is provided with p-HEMT of the single heterostructure lacking the back side electron-donating layer 3 and the back side space layer 4.

While the structure in which the channel layer is an InGaAs layer has been explained, it is clear that similar effects are provided even when III-V compound semiconductor layers, such as a GaAs layer, AlGaAs layer and InGaP layer, are used as the channel layer.

An example of a method of fabricating an epitaxial substrate of the layer structure shown in FIG. 1 is described below. First a GaAs monocrystal substrate 1 is prepared. The GaAs monocrystal substrate 1 is a high-resistance semi-insulating GaAs monocrystal substrate and preferable fabrication methods include the LEC (Liquid Encapsulated Czochralski) method, VB (Vertical Bridgeman) method and VGF (Vertical Gradient Freezing) method. Whichever method is used, a substrate with a gradient of about 0.05 to 10° from one crystallographic plane direction is prepared.

The surface of the GaAs monocrystal substrate 1 prepared as described above is subjected to degreasing/cleaning, etching, washing and drying, then the substrate is placed on the heating table of a crystal growth furnace. Application of heat is started after having substituted high purity hydrogen for the inside of the furnace sufficiently. Arsenic raw material is introduced inside the furnace after reaching stable moderate temperature. Gallium raw material is then introduced when producing a GaAs layer. Gallium and aluminum raw materials are introduced in addition to the arsenic raw material when producing an AlGaAs layer. Gallium and indium raw materials are introduced in addition to the arsenic raw material when producing an InGaAs layer. Desired layered structure is developed by controlling the feeding rate and time of each raw material. Lastly, the feeding of each raw material is stopped to stop crystal growth, and after cooling the layered epitaxial substrate, as shown in FIG. 1, is taken out of the furnace to complete crystal growth. The substrate temperature during crystal growth is usually about 500 to 800° C.

The epitaxial substrate of the layer structure shown in FIG. 1 can be fabricated by the MOCVD method. An advantage of using the MOCVD method is that organometallic compounds or hydrides of atomic species constituting the epitaxial layer can be used as raw material.

Actually, arsenic trihydride (arsine) is usually used as an arsenic raw material for epitaxial growth; however, alkyl arsine in which a hydrogen atom of arsine is substituted by an alkyl group having one to four carbon atoms can be used. As raw material for gallium, aluminum and indium, trialkyl or trihydride compounds of respective metal atoms are generally used to which an alkyl group having one to three carbon atoms or hydrogen atoms is attached.

For n-type dopant, a hydride or an alkyl compound having an alkyl group with one to three carbon atoms of silicone, germanium, tin, sulfur, selenium, etc. can be used.

The following examples and comparative examples illustrate the present invention in detail, but are not intended to limit the scope of the invention. In addition, the layer structure of the epitaxial substrate shown in examples is for measuring the characteristics of epitaxial substrate, and the actual epitaxial substrate for p-HEMT is configured to have additional layers such as n-GaAs and n-AlGaAs layers. It is obvious, however, that such actual epitaxial substrate for p-HEMT will have similar characteristics to those of the examples described below.

Example 1

Figure 2:
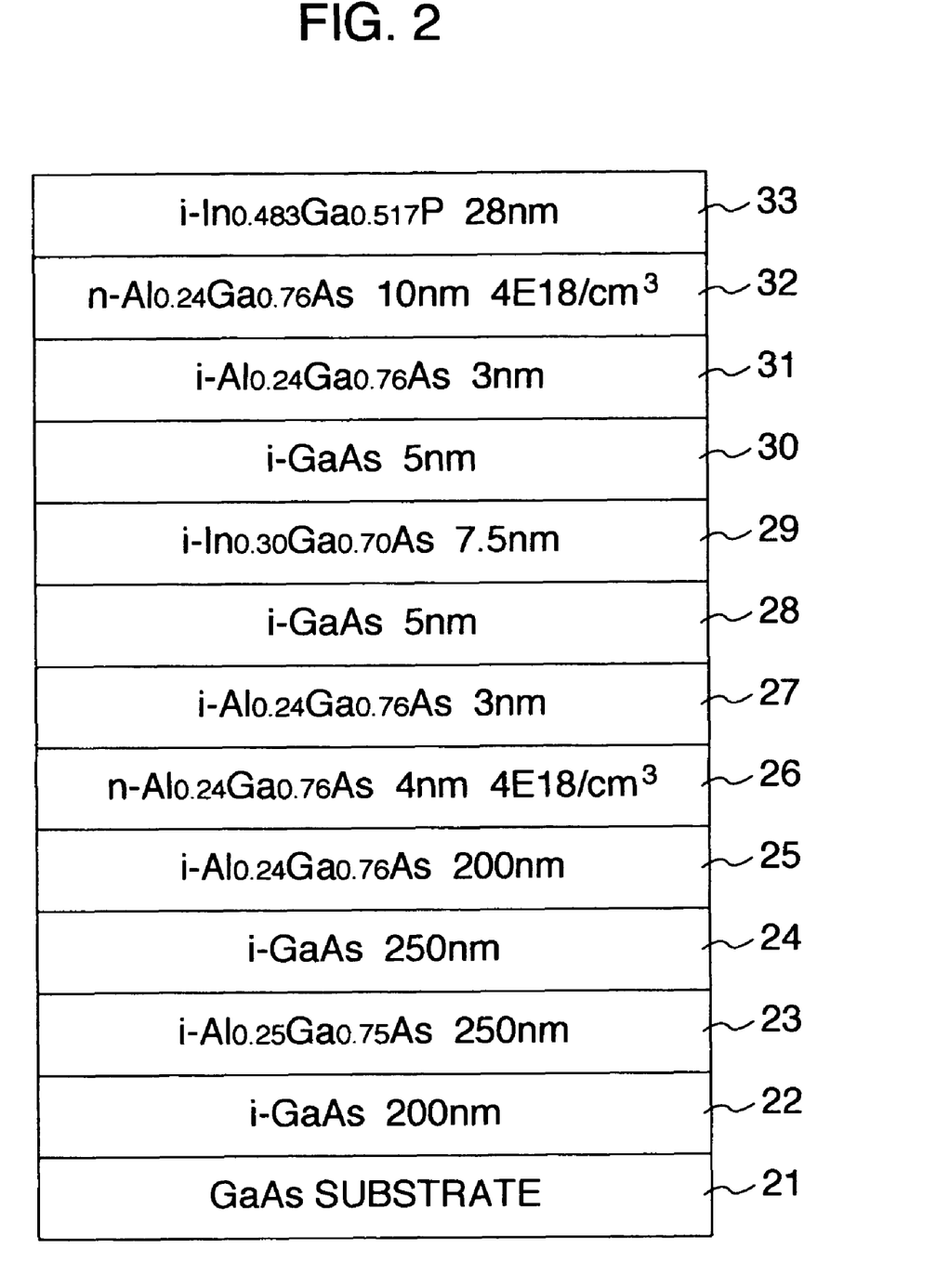
FIG. 2 is a layer structure view showing the first example of the epitaxial substrate according to the present invention.

The layer structure shown in FIG. 2 was created on a semi-insulating GaAs monocrystal substrate, which was prepared by the VGF method, through epitaxial growth by the MOCVD method using a vacuum barrel type MOCVD furnace.

In FIG. 2, reference numeral 21 denotes a GaAs monocrystal substrate, and reference numerals 22 to 25 denote buffer layers formed on the GaAs monocrystal substrate 21. Here, the buffer layers 22 to 25 are formed as 200 nm-thick i-GaAs layer, 250 nm-thick i-$A_{0.25}Ga_{0.75}As$ layer, 250 nm-thick i-GaAs layer and 200 nm-thick i-$Al_{0.24}Ga_{0.76}As$ layer, respectively.

Reference numeral 26 denotes the back side electron-donating layer doped with n type impurities at $4 \times 10^{18}/cm^3$ that is formed as a 4 nm-thick n-$Al_{0.24}Ga_{0.76}As$ layer, and back side space layers 27 and 28 are formed in this order on the back side electron-donating layer 26. Here, the back side space layer 27 is a 3 nm-thick i-$Al_{0.24}Ga_{0.76}As$ layer and the back side space layer 28 is a 5 nm-thick i-GaAs layer. Reference numeral 29 is a channel layer in which two dimensional electrons flow to form two dimensional electron gas, and represents a strained channel layer consisting of a 7.5 nm-thick i-$In_{0.30}Ga_{0.70}As$ layer.

Reference numerals 30 and 31 denote front side space layers. Here, the front side space layer 30 is a 5 nm-thick i-GaAs layer and the front side space layer 31 is a 3 nm-thick i-$Al_{0.24}Ga_{0.76}As$ layer.

Reference numeral 32 denotes a front side electron-donating layer consisting of a 10 nm-thick n-$Al_{0.24}Ga_{0.76}As$ layer doped with n type impurities at $4 \times 10^{18}/cm^3$. A 28 nm-thick i-$In_{0.483}Ga_{0.517}P$ layer in orderly state is formed on and in close contact with the front side electron-donating layer 32 as a gate barrier layer 33.

Raw materials of the Group III elements included trimethylgallium, trimethylaluminum and trimethylindium, and as raw materials of the Group V elements, arsine and phosphine were used. For n-type dopant, silane diluted to 0.005% in hydrogen was used. High purity hydrogen was used as carrier gas for the raw materials, and epitaxial growth was promoted under the conditions of reactor pressure of 0.1 atm, growth temperature of 650° C. and growth rate of 3 to 1 μm/hr. The In composition of 0.483 was used for the gate barrier layer 33, because this condition favored lattice matching to the GaAs and AlGaAs layers. The InGaP layer in orderly state was thus produced.

The compound semiconductor epitaxial substrate prepared as described above so as to have the layer structure shown in FIG. 2 was subjected to hole measurement by the Van der Pauw method. Results show that the two dimensional electron gas concentration in the channel layer 29 at room temperature (300 K) was $2.85 \times 10^{12}/cm^2$, electron mobility at room temperature (300 K) was 7830 $cm^2/V \cdot s$, the two dimensional electron gas concentration at 77 k was $2.85 \times 10^{12}/cm^2$, and electron mobility at 77 k was 27400 $cm^2/V \cdot s$. The amount of dopant supplied to the front side electron-donating layer 32 during manufacture was as small as 51.9 cc. In addition, CV measurement using an Al Schottky electrode was performed on this structure; the pinch off voltage at the residual carrier density of $1 \times 10^{15}/cm^3$ was −2.91 V.

Comparative Example 1

An epitaxial substrate was prepared by the MOCVD method in the same manner as Example 1, in which the i-$In_{0.483}Ga_{0.517}P$ layer in orderly state constituting the gate barrier layer 33 of the layer structure of Example 1 shown in FIG. 2 was replaced by a 28 nm-thick i-$Al_{0.24}Ga_{0.76}As$ layer, the n type impurity concentration in the electron-donating layers 26 and 32 was specified to be $4.5 \times 10^{18}/cm^3$, and other layers were as in Example 1.

Hole measurement by the Van der Pauw method was performed on the layer structure of Comparative Example 1, which is of a conventional p-HEMT structure. Results show that the two dimensional electron gas concentration in the channel layer 29 at room temperature (300 K) was $2.84 \times 10^{12}/cm^2$, electron mobility at room temperature (300 K) was 7940 $cm^2/V \cdot s$, the two dimensional electron gas concentration at 77 k was $2.89 \times 10^{12}/cm^2$, and electron mobility at 77 k was 27800 $cm^2/V \cdot s$, and the amount of dopant supplied to the front side electron-donating layer 32 was 58.9 cc. In addition, CV measurement using an Al Schottky electrode was performed on this structure; the pinch off voltage at the residual carrier density of $1 \times 10^{15}/cm^3$ was −2.52 V.

When the amount of dopant supplied to the front side electron-donating layer 32 was reduced to the same amount of 51.9 cc as Example 1, the two dimensional electron gas concentration in the channel layer 29 at room temperature (300 K) was $2.28 \times 10^{12}/cm^2$, resulting in a decrease of $0.57 \times 10^{12}/cm^2$ in the two dimensional electron gas concentration at room temperature (300 K) compared to Example 1.

In Example 1 according to the present invention, the values for the two dimensional electron gas concentration and electron mobility were almost equal to those for Comparative Example 1, which is a conventional example, while the amount of dopant supplied to the front side electron-donating layer 32 was smaller by 10% or more than that in Comparative Example 1. Thus by using the configuration of Example 1, the values for the two dimensional electron gas concentration and electron mobility that were equivalent to those for conventional p-HEMT could be obtained even when a smaller amount of dopant was supplied. Because equivalent two dimensional electron gas concentration and electron mobility could be thus achieved with a smaller supply of dopant, gate withstand voltage can be improved without decreasing the driving current value of transistors.

Example 2

Figure 3:
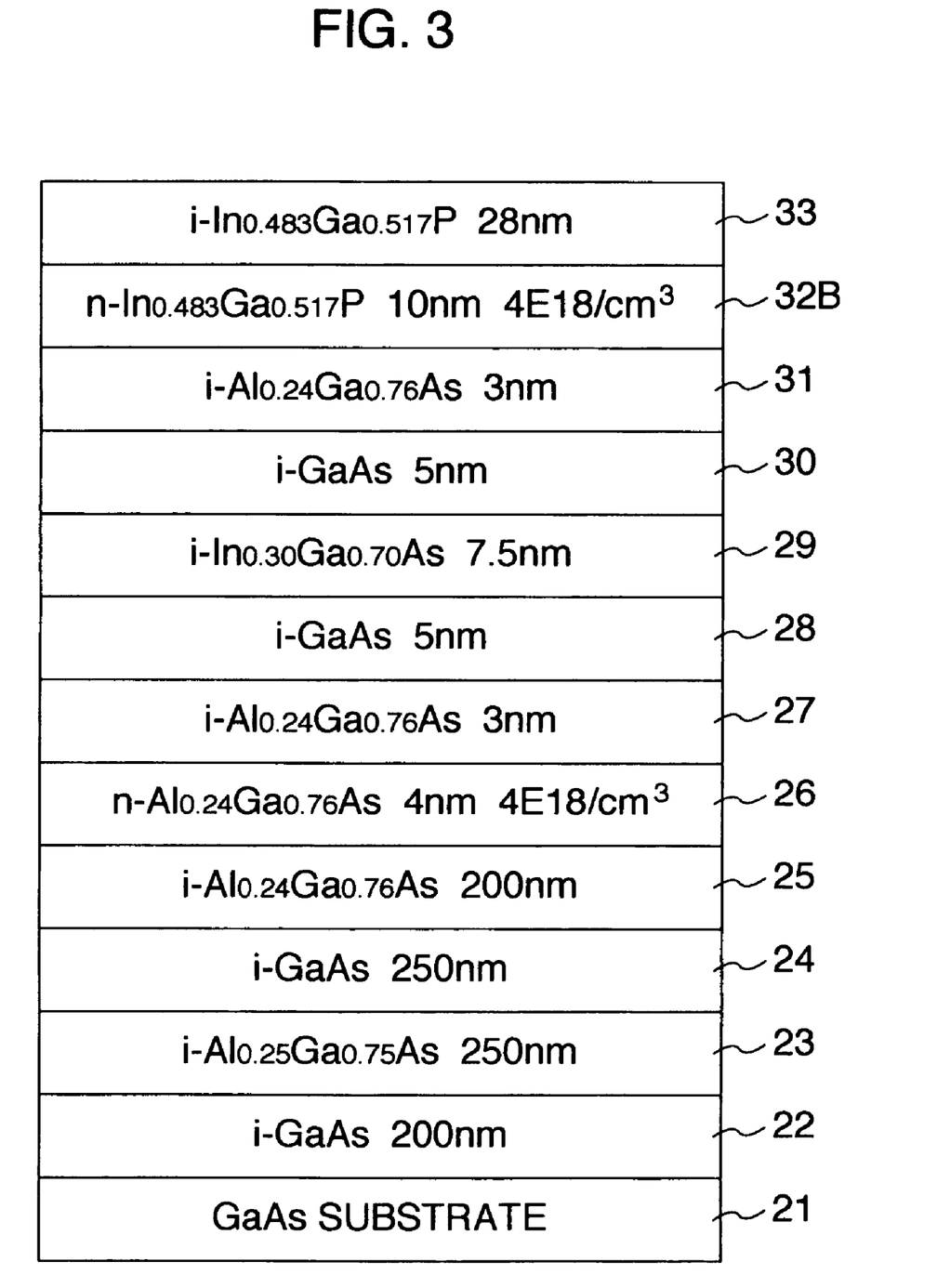
FIG. 3 is a layer structure view showing the second example of the epitaxial substrate according to the present invention.

The epitaxial substrate of the layer structure shown in FIG. 3 was prepared by the MOCVD method in the same way as Example 1. The layer structure of Example 2 shown in FIG. 3 differs from that of Example 1 only in that the front side electron-donating layer 32B consisted of a 10 nm-thick n-$In_{0.483}Ga_{0.517}P$ layer with a carrier density of $4 \times 10^{18}/cm^3$ containing n type impurities. Therefore, codes are assigned to the other layers in FIG. 3 that are identical with the codes of the corresponding layers in FIG. 2, and are not described here.

Hole measurement by the Van der Pauw method was performed on the layer structure of Example 2; results show that the two dimensional electron gas concentration in the channel layer 29 at room temperature (300 K) was $2.87 \times 10^{12}/cm^2$, electron mobility at room temperature (300 K) was 7840 $cm^2/V \cdot s$, the two dimensional electron gas concentration at 77 k was $2.85 \times 10^{12}/cm^2$, and electron mobility at 77 k was 29100 $cm^2/V \cdot s$, and the amount of dopant supplied during manufacture to the front side electron-donating layer was 78.5 cc. In addition, CV measurement using an Al Schottky electrode was performed on this structure; the pinch off voltage at the residual carrier density of $1 \times 10^{15}/cm^3$ was −3.07 V.

Comparative Example 2

Comparative Example 2 was conducted by the MOCVD method in accordance with Example 2, which had the same layer structure as Example 2 shown in FIG. 3 except that a 28 nm-thick i-$Al_{0.24}Ge_{0.76}As$ layer was substituted for the gate barrier layer 33 of Example 2 shown in FIG. 3 and the n type impurity concentration in the electron-donating layers 26 and 32B was specified to be $4.5 \times 10^{18}/cm^3$. The layer structure of this comparative example 2 is of a conventional p-HEMT structure.

Hole measurement by the Van der Pauw method was performed on the layer structure of Comparative Example 2; results show that the two dimensional electron gas concentration in the channel layer 29 at room temperature (300 K) was $2.88 \times 10^{12}/cm^2$, electron mobility at room temperature (300 K) was 7860 $cm^2/V \cdot s$, the two dimensional electron gas concentration at 77 k was $2.86 \times 10^{12}/cm^2$, and electron mobility at 77 k was 30100 $cm^2/V \cdot s$, and the amount of dopant supplied during manufacture to the front side electron-donating layer was 87.3 cc. In addition, CV measurement using an Al Schottky electrode was performed on this structure; the pinch off voltage at the residual carrier density of $1 \times 10^{15}/cm^3$ was −2.63 V.

When the amount of dopant supplied to the front side electron-donating layer 32B was reduced to the same amount of 78.5 cc as Example 2, the two dimensional electron gas concentration in the channel layer 29 at room temperature (300 K) was $2.30 \times 10^{12}/cm^2$, resulting in a decrease of $0.55 \times 10^{12}/cm^2$ in the two dimensional electron gas concentration at room temperature (300 K) compared to Example 2.

In Example 2 according to the present invention, the values for the two dimensional electron gas concentration and electron mobility were almost equal to those for Comparative Example 2, which is a conventional example, while the amount of dopant supplied to the front side electron-donating layer 32 was smaller by 10% or more than that in Comparative Example 2. Thus, by using the configuration of Example 2, values for the two dimensional electron gas concentration and electron mobility that were equivalent to those for conventional p-HEMT could be obtained even when a smaller amount of dopant was supplied. Because equivalent two dimensional electron gas concentration and electron mobility could be thus achieved with a smaller supply of dopant, gate withstand voltage can be improved without decreasing the driving current value of transistors.

Example 3

Figure 4:
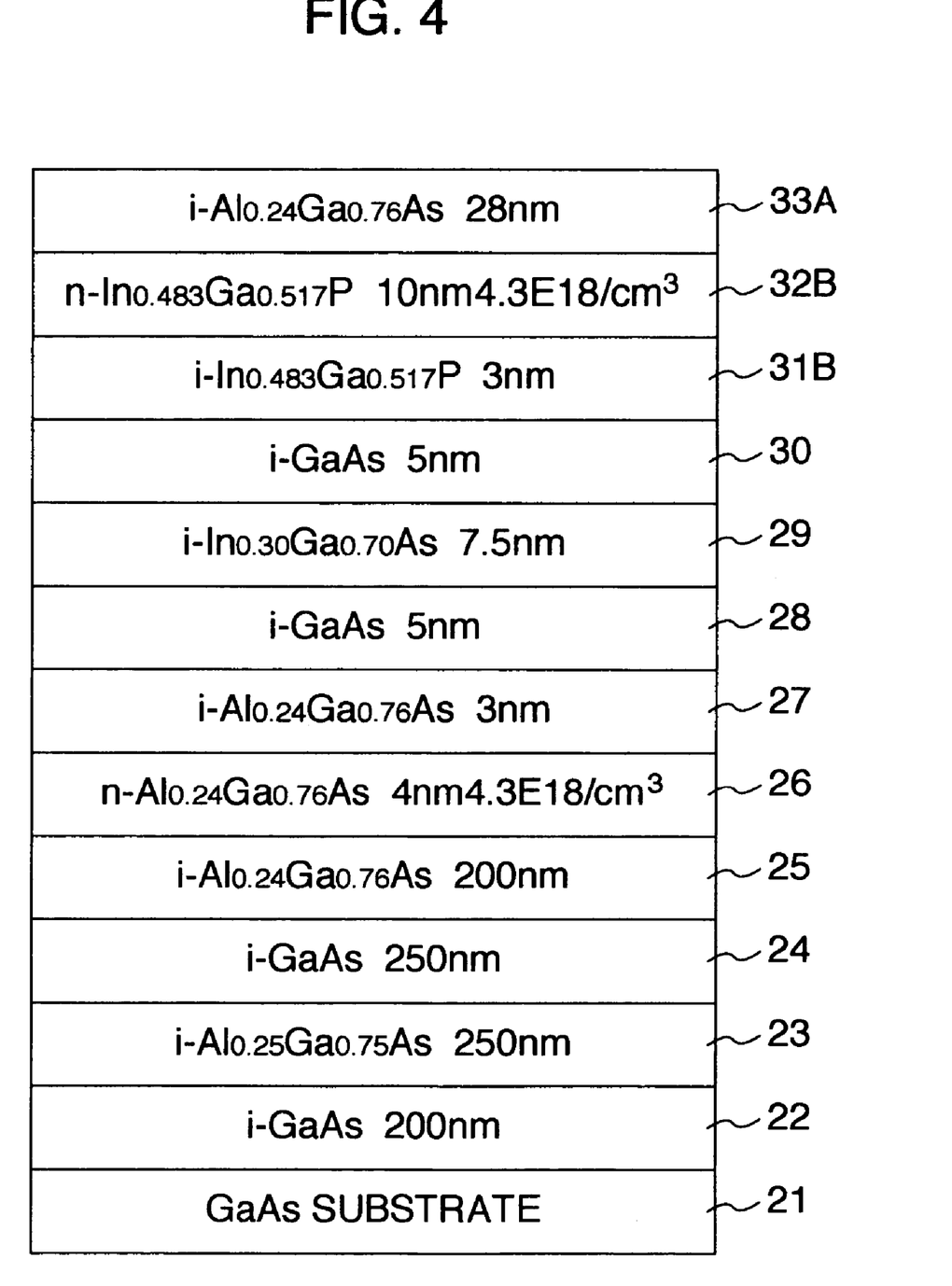
FIG. 4 is a layer structure view showing the third example of the epitaxial substrate according to the present invention.

The epitaxial substrate of the layer structure shown in FIG. 4 was prepared by the MOCVD method in the same way as Example 1. The layer structure of Example 3 shown in FIG. 4 differed from that of Example 2 only in that a 3 nm-thick i-$In_{0.483}Ga_{0.517}P$ layer in orderly state was replaced for the i-AlGaAs layer of the front side space layer 31B, the gate barrier layer 33A consisted of a 28 nm-thick i-$Al_{0.24}Ga_{0.76}As$ layer, and the n type impurity concentration in the electron-donating layers 26 and 32B was specified to be $4.3 \times 10^{18}/cm^3$. Therefore, codes are assigned to the other layers in FIG. 4 that are identical with the codes of the corresponding layers in FIG. 3, and are not described here.

Hole measurement by the Van der Pauw method was performed on the layer structure of Example 3; results show that the two dimensional electron gas concentration in the channel layer 29 at room temperature (300 K) was $2.89 \times 110^{12}/cm^2$, electron mobility at room temperature (300 K) was 7890 $cm^2/V \cdot s$, the two dimensional electron gas concentration at 77 k was $2.83 \times 10^{12}/cm^2$, and electron mobility at 77 k was 31200 $cm^2/V \cdot s$, and the amount of dopant supplied to the front side electron-donating layer was 84.7 cc. In addition, CV measurement using an Al Schottky electrode was performed on this structure; the pinch off voltage at the residual carrier density of $1 \times 10^{15}/cm^3$ was −2.80 V.

In Example 3 according to the present invention, the values for the two dimensional electron gas concentration and electron mobility were almost equal to those for Comparative Example 2, which is a conventional example, while the amount of dopant supplied to the front side electron-donating layer 32B was smaller by 3% or more than that in Comparative Example 2. Thus by using the configuration of Example 3, the values for the two dimensional electron gas concentration and electron mobility that were equivalent to those for conventional p-HEMT could be obtained even when a smaller amount of dopant was supplied. Because equivalent two dimensional electron gas concentration and electron mobility could be thus achieved with a smaller supply of dopant, gate withstand voltage can be improved without decreasing the driving current value of transistors.

INDUSTRIAL APPLICABILITY

The present invention provides an epitaxial substrate of the p-HEMT structure having the best characteristic ever possible using InGaP material that is superior in both crystalline purity and temperature characteristics at the time of manufacture of electronic devices.

The invention claimed is:

1. A compound semiconductor epitaxial substrate having a pseudomorphic high electron mobility field effect transistor structure comprising:
    a starting substrate,
    an InGaAs layer as a strained channel layer,
    an InGaP layer containing n type impurities and not in an orderly state as a front side electron-donating layer, and
    an InGaP layer in an orderly state as a gate barrier layer, in this order,
    wherein the InGaP front side electron-donating layer is lattice matched to a GaAs layer disposed between the starting substrate and the InGaP front side electron-donating layer,
    the orderly state is a state where the band gap value for the InGaP layer is 1.85 eV or less, and
    the compositional ratios of the InGaP front side electron-donating layer and the InGaP gate barrier layer are the same.

2. A method of manufacturing a compound semiconductor epitaxial substrate according to claim 1, comprising epitaxial growth of each layer except for the starting substrate of the compound semiconductor epitaxial substrate using a metal-organic chemical vapor deposition (MOCVD) method.

* * * * *